United States Patent
Kimura

[11] Patent Number: 6,140,185
[45] Date of Patent: Oct. 31, 2000

[54] METHOD OF MANUFACTURING SEMICONDUCTOR DEVICE

[75] Inventor: Hajime Kimura, Hyogo, Japan

[73] Assignee: Mitsubishi Denki Kabushiki Kaisha, Tokyo, Japan

[21] Appl. No.: 09/185,652

[22] Filed: Nov. 5, 1998

[30] Foreign Application Priority Data

May 15, 1998 [JP] Japan ................... 10-133389

[51] Int. Cl.⁷ .................................. H01L 21/8234
[52] U.S. Cl. .................. 438/275; 438/197; 438/258
[58] Field of Search .................... 438/197, 258

[56] References Cited

U.S. PATENT DOCUMENTS

| | | |
|---|---|---|
| 4,609,428 | 9/1986 | Fujimura et al. . |
| 4,734,157 | 3/1988 | Carbaugh et al. . |
| 4,795,529 | 1/1989 | Kawasaki et al. . |
| 5,336,365 | 8/1994 | Goda et al. . |
| 5,368,684 | 11/1994 | Ishikawa et al. . |
| 5,576,226 | 11/1996 | Hwang . |
| 5,972,722 | 4/1997 | Visokay et al. . |

FOREIGN PATENT DOCUMENTS

| | | |
|---|---|---|
| 0 407 169 | 4/1990 | European Pat. Off. . |
| 63-205944 | 8/1988 | Japan . |
| 4-010564 | 1/1992 | Japan . |
| 4-260364 | 9/1992 | Japan . |
| 6-21374 | 1/1994 | Japan . |
| 6-342891 | 12/1994 | Japan . |
| 7-297298 | 11/1995 | Japan . |
| 8-078533 | 3/1996 | Japan . |
| 8-204028 | 9/1996 | Japan . |
| 9-92729 | 4/1997 | Japan . |

*Primary Examiner*—John F. Niebling
*Assistant Examiner*—Jonathan Hack
*Attorney, Agent, or Firm*—McDermott, Will & Emery

[57] ABSTRACT

A first gate oxide film is formed on a surface of a silicon substrate. A first polycrystalline silicon film is formed on the first gate oxide film, and patterned so that its side surface is tapered. Silicon oxide film exposed through the first polycrystalline silicon is removed, and a second silicon oxide film having film thickness different from that of the first silicon oxide film is formed by thermal oxidation. Thus, dual gate oxide is manufactured. Accordingly, a method of manufacturing a semiconductor device is provided which can improve reliability of the transistor and can improve production yield, by suppressing generation of foreign matters.

10 Claims, 12 Drawing Sheets the page.

METHOD OF MANUFACTURING SEMICONDUCTOR DEVICE

BACKGROUND OF THE INVENTION

1. Field of the Invention

The present invention relates to a method of manufacturing a semiconductor device and, particularly, to a method of manufacturing a semiconductor device having a plurality of gate insulating layers of different film thicknesses in one device.

2. Description of the Background Art

Among latest semiconductor devices, the number of those having gate oxide films of two or more film thicknesses (dual gate oxide) in one device has been increasing. A method of manufacturing a conventional semiconductor device having the dual gate oxide will be described in the following.

FIGS. 14 to 17 are schematic cross sections showing, in order, the steps of manufacturing the conventional semiconductor device having dual gate oxide. Referring to FIG. 14, a field oxide film 2 is formed on a surface of a silicon substrate 3, and thereafter, a first gate oxide film 1a is formed on silicon substrate 3 by thermal oxidation.

Referring to FIG. 15, a photoresist 105a is applied to be in direct contact with first gate oxide film 1a and field oxide film 2, and patterned by common photolithography. The gate oxide film 1a exposed through resist pattern 105a is removed, for example, by wet etching. Thereafter, resist pattern 105 is removed.

Referring to FIG. 16, at portions where the silicon oxide film has been removed by the wet etching, the surface of silicon substrate 3 is exposed. Thereafter, thermal oxidation is performed again.

Referring to FIG. 17, by the thermal oxidation, the second gate oxide film 1a is formed at the exposed surface of silicon substrate 3, and the thickness of the first gate oxide film 1a is increased. In this manner, thickness Ta of the first gate oxide film 1a is made thicker than the thickness Tb of the second gate oxide film 1b, and thus the dual gate oxide is completed.

In the process shown in FIGS. 14 to 17, however, photoresist 105a is formed to be in direct contact with first gate oxide film 1a as shown in FIG. 15. Generally, photoresist contains, as an impurity, Na (Sodium) or the like. Therefore, if photoresist 105a is formed to be in direct contact with gate oxide film 1a, Na in photoresist 105a enters gate oxide film 1a. Thus introduced Na undesirably provides conductivity to gate oxide film 1a or causes threshold voltage of MOS (Metal Oxide Semiconductor) transistor to deviate from the desired value, thereby significantly degrading reliability of the transistor.

For putting the wafer in a gate oxidation furnace to form second gate oxide film 1b, pre-processing such as processing with dilute hydrofluoric acid is performed. In the step of pre-processing, however, part of the first gate oxide film 1a is etched, and the thickness of the first gate oxide film 1a varies. Consequently, the threshold voltage of the MOS transistor deviates from the desired value, significantly degrading reliability of the transistor.

The following method has been proposed as a countermeasure.

FIGS. 18 to 23 are schematic cross sections showing, in order, the steps of manufacturing a conventional semiconductor device having the dual gate oxide which can solve the above described problem. Referring to FIG. 18, filed oxide film 2 is formed on silicon substrate 3, and thereafter, first gate oxide film 1a is formed by thermal oxidation. Thereafter, a first polycrystalline silicon film 204a doped with an impurity is formed on the entire surface, as a protective film for the first gate oxide film 1a.

Referring to FIG. 19, on the first polycrystalline silicon film 204a, a photoresist 205a is applied and patterned by common photolithography. The first polycrystalline silicon film 204a exposed from resist pattern 205a is removed by unisotropic etching. Thereafter, resist pattern 205a is removed.

Referring to FIG. 20, at portions where the first polycrystalline silicon film 204a has been removed, the first silicon oxide film 1a is exposed. In this state, the exposed first silicon oxide film 1a is removed by wet etching, and at that portion, the surface of silicon substrate 3 is exposed. Thereafter, thermal oxidation is performed again.

Referring to FIG. 21, by thermal oxidation, a second silicon oxide film 1b having film thickness different from that of the first silicon film 1a is formed on silicon substrate 3. Further, by the thermal oxidation, the surface of first polycrystalline silicon film 204a is also oxidized, and an oxide coating 6 of silicon oxide is formed. In this manner, the dual gate oxide having first and second silicon oxide films 1a and 1b of mutually different film thicknesses is formed.

Referring to FIG. 22, thereafter, a second polycrystalline silicon film 204b doped with an impurity is formed on the entire surface. A photoresist 205b is applied on the second polycrystalline silicon film 204b, and patterned by common photolithography. Using resist pattern 205b as a mask, the second polycrystalline silicon film 204 is unisotropically etched. Thereafter, resist pattern 205b is removed.

Referring to FIG. 23, by the unisotropic etching, the second polycrystalline silicon film 204b is patterned such that it is spaced from the first polycrystalline silicon film 204a. Thereafter, oxide coating 6 is removed, each of the first and second polycrystalline silicon films 204a and 204b is patterned, and a gate electrode layer is formed. By introducing an impurity using the gate electrode layer, field oxide film 2 and so on as a mask, a pair of source/drain regions (not shown) are formed at the surface of silicon substrate 3, on both sides of a lower region of gate electrode layer. Thus an MOS transistor is completed.

In the process shown in FIGS. 18 to 23, photoresist 205a is formed on the first polycrystalline silicon film 204a, as shown in FIG. 19, and not directly on the first gate oxide film 1a. Therefore, entrance of Na from photoresist 205a to the first gate oxide film 1a is prevented. Therefore, the first gate oxide film 1a is prevented from being rendered conductive, and variation of the threshold voltage of the MOS transistor is prevented.

At the time of processing of dilute hydrofluoric acid performed for putting the wafer into the gate oxidation furnace to form the second gate oxide film 1b, there is the polycrystalline silicon film 204a on the first gate oxide film 1a. Therefore, the first gate oxide film 1a is not etched in the process with diluted fluoric acid.

In the process shown in FIGS. 18 to 23, however, the second polycrystalline silicon film 204b is unisotropically etched as shown in FIGS. 22 and 23. The unisotropic etching leaves residue $204b_1$ of second polycrystalline silicon film 204b on a sidewall of the first polycrystalline silicon film 204a, in the form of a sidewall spacer. The residue $204b_1$ in the form of a sidewall spacer is so thin that it is readily separated or peeled off in the wet etching process for removing oxide coating 6, for example, possibly causing short-circuit between other conductive layers, and hence causing lower yield.

SUMMARY OF THE INVENTION

An object of the present invention is to provide a method of manufacturing a semiconductor device which can improve reliability of transistors and improve yield by preventing generation of foreign matters.

The method of manufacturing a semiconductor device in accordance with a first aspect of the present invention is for manufacturing a semiconductor having gate insulating layers of different film thicknesses, and includes the following steps.

First, a first gate insulating layer is formed on a main surface of a semiconductor substrate. A protective film is formed on the first gate insulating layer. The protective layer is patterned so that a part of the surface of the first gate insulating layer is exposed, and a side surface of the patterned protective layer is inclined surface extending sideward toward a lower portion. The first gate insulating layer exposed from the protective layer will be the second gate insulating layer having film thickness different from that of the first gate insulating layer.

In the method of manufacturing a semiconductor device in accordance with this aspect of the present invention, the side surface of the protective layer is inclined surface extending sideward toward a lower portion. Therefore, as compared with the prior art example in which the side surface of the protective layer is vertical, the residue is less likely left on the side of surface. This suppresses generation of foreign matters, and production yield can be improved.

Further, the protective layer is formed on the first gate insulating layer, and therefore the photoresist is formed not directly on the first gate insulating layer. Therefore, entrance of impurity from the photoresist to the first gate insulating layer is prevented, and hence reliability of the transistor is not degraded thereby.

In the above described aspect, the side surface of the protective layer is inclined by at least 70° and at most 80° with respect to the main surface of the semiconductor substrate.

As the side surface of the protective layer is inclined at such angle, residue left on the side surface of the protective layer can effectively be prevented.

In the above described aspect, preferably, the second gate insulating layer is formed and, thereafter, a second protective layer is formed on the second gate insulating layer and on the protective layer. The second protective layer is patterned to remove at least the second protective layer on the protective layer, and a side surface of the patterned second protective layer opposes to the side surface of the protective layer with a space therebetween. The second protective layer is formed on the second gate insulating layer, and therefore photoresist is not directly formed on the second gate insulating layer. Therefore, entrance of impurity from the photoresist to the second gate insulating layer is prevented, and hence degradation of reliability of the transistor because of the impurity can be prevented.

In the above described aspect, the side surface of the second protective layer is inclined surface extending sideward as it goes up.

As the side surface of the second protective layer is etched to be such an inclined surface, the residue, if any, on the side surface of the protective layer can effectively removed by this etching.

In the above described aspect, preferably, the side surface of the second protective layer is inclined by at least 100° and at most 110° with respect to the main surface of the semiconductor substrate.

As the second protective layer is etched so that the side surface of the second protective layer is inclined by such an angle, the residue on the side surface of the protective layer can effectively be removed.

In the above described aspect, preferably, the protective layer is formed of a layer containing polycrystalline silicon, while the second protective layer is formed of a layer containing amorphous silicon.

This facilitates patterning such that the side surface of the protective layer is inclined extending sideward as it goes down and patterning such that the side surface of the second protective layer is inclined extending sideward as it goes up.

In the above described aspect, preferably, the protective layer and the second protective layer are conductive layers for the gate electrode.

Accordingly, the gate electrode layer can be formed by the protective layer and the second protective layer.

The method of manufacturing a semiconductor device in accordance with another aspect of the present invention is for manufacturing a semiconductor device having gate insulating layers of different film thicknesses, and the method includes the following steps.

A first gate insulating layer is formed on a main surface of a first region of a semiconductor substrate which substrate having first and second regions adjacent to each other with an element isolating insulating layer interposed. A first gate electrode conductive layer is formed covering the first gate insulating layer and having an end portion positioned on the element isolating insulating layer. A second gate insulating layer having film thickness different from that of the first gate insulating layer is formed on the main surface of the second region of the semiconductor substrate. A second gate electrode conductive layer is formed covering the second gate insulating layer and having an end portion resting on the end portion of the first gate electrode conductive layer. A silicide layer is formed to be in contact with upper surfaces of the first and second gate electrode conductive layers.

In the method of manufacturing a semiconductor device in accordance with this aspect, end portions of the first and second gate electrode conductive layers are overlapped on the element isolating insulating layer. Therefore, the silicide layer formed on the first and second gate electrode conductive layers is not in direct contact with the element isolating insulating layer. Therefore, at the portion where the silicide layer is in direct contact with the element isolating insulating layer, separation or peeling, which may possibly result in foreign matters, can be prevented. Therefore, production yield is improved.

In this aspect, preferably, the element isolating insulating layer includes a silicon oxide film, and the first and second gate electrode conductive layers are formed of layers containing polycrystalline silicon.

Accordingly, separation of the silicide layer, resulting in foreign matters, can be prevented. In the above described aspect, preferably, the first and second gate electrode conductive layers and the silicide layer are patterned so as to form a first gate electrode layer having a stacked structure including the first gate electrode conductive layer and a silicide layer, as well as the second gate electrode layer having a stacked structure including the second gate electrode conductive layer and a silicide layer.

Accordingly, a gate electrode layer having polycide structure is formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following with reference to the figures.

First Embodiment

Figure 1:
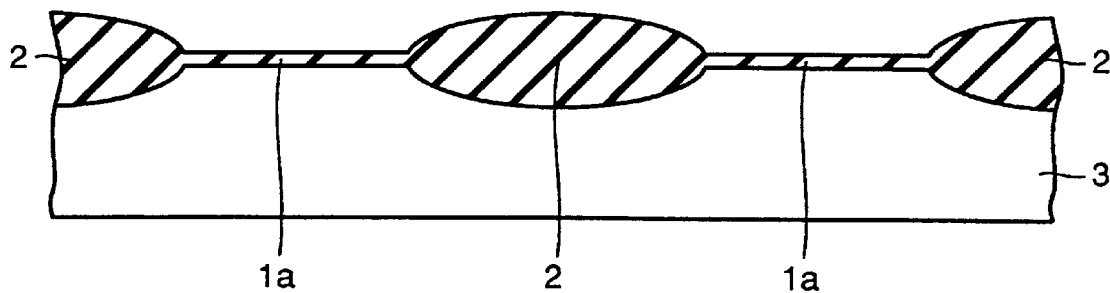
FIGS. 1 to 9 are schematic cross sections showing, in order, steps of the method of manufacturing a semiconductor device in accordance with a first embodiment of the present invention.

Referring to FIG. 1, a field oxide film (element isolating insulating layer) 2 is formed, for example, by LOCOS method on a surface of a silicon substrate 3. Thereafter, a first gate oxide film 1a is formed on the surface of silicon substrate 3 by thermal oxidation.

Figure 2:
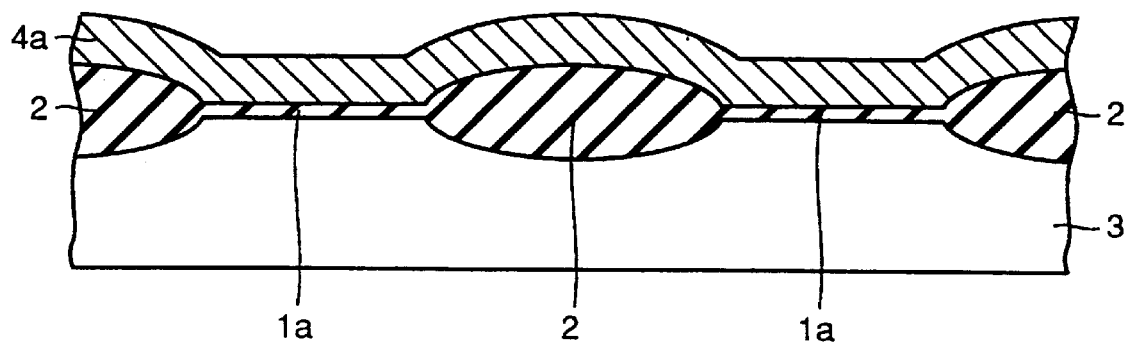

Referring to FIG. 2, a first polycrystalline silicon film 4a doped with an impurity is formed as a first protective film, on the entire surface. The first polycrystalline silicon film 4a may be an amorphous silicon film doped with an impurity.

Figure 3:
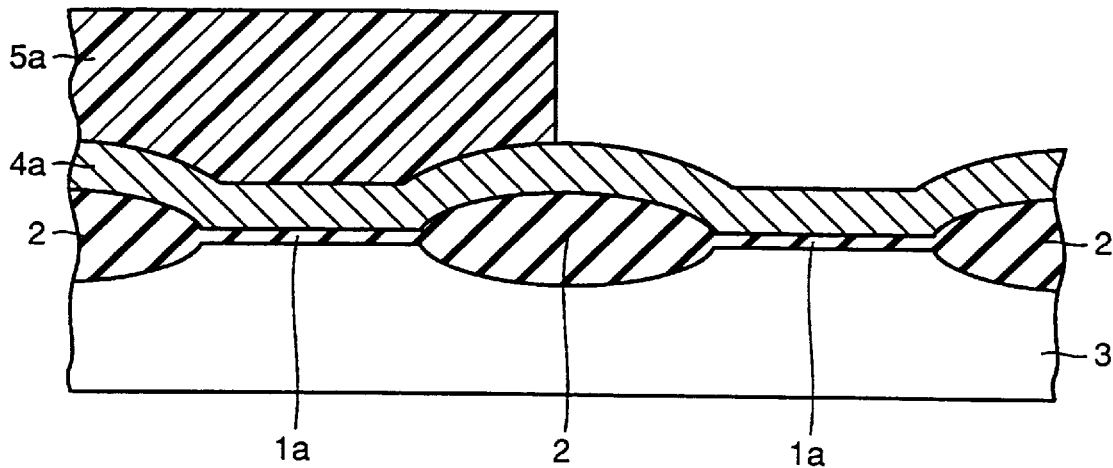

Referring to FIG. 3, a photoresist 5a is applied to the surface of the first polycrystalline silicon film 4a, and patterned by common photolithography. Using resist pattern 5a as a mask, the first polycrystalline silicon film 4a is etched. Thereafter, resist pattern 5a is removed.

Figure 4:
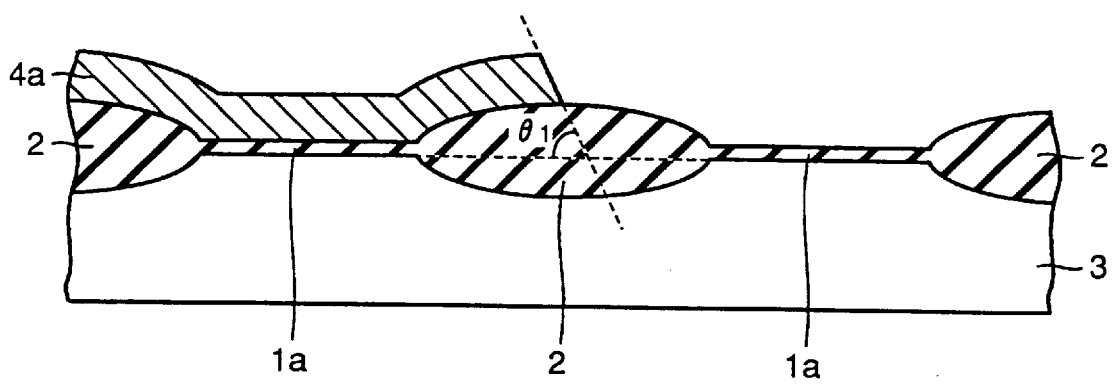

Referring to FIG. 4, by the etching, the first polycrystalline silicon film 4a is patterned. A side surface of the patterned first polycrystalline silicon film 4a is inclined, extended sideward toward the silicon substrate (lower side in the figure), that is, the side surface has a so-called tapered shape. The angle $\theta_1$ of inclination of the inclined surface is controlled to be 70° to 80° with respect to the surface of silicon substrate 3.

In order to attain the tapered shape, it is necessary to set process conditions to ensure high selectivity of the underlying silicon oxide films 1a and 2, and to prevent generation of silicon residue. The aforementioned tapered shape and high selectivity can be attained by an etching process employing $Cl_2/O_2$ used in an electron cyclotron type etching apparatus when $O_2$ concentration is set as high as about 15 to about 25% and RF power as low as about 30 w.

Thereafter, the first silicon oxide film 1a exposed from the first polycrystalline silicon film 4a is removed by wet etching, and the surface of silicon substrate 3 at that portion is exposed.

Figure 5:
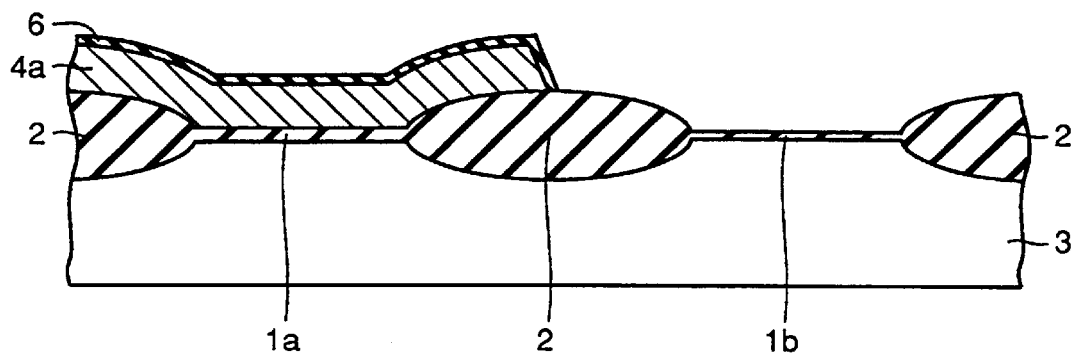

Referring to FIG. 5, by thermal oxidation, a second gate oxide film 1b is formed on the exposed surface of silicon substrate 3, and in addition, the surface of the polycrystalline silicon film 4a is oxidized to be an oxide coating 6 of silicon oxide. Condition of thermal oxidation is set such that film thickness of the second gate oxide film 1b differs from the film thickness of the first gate oxide film 1a. Thus dual gate oxide is formed.

Figure 6:
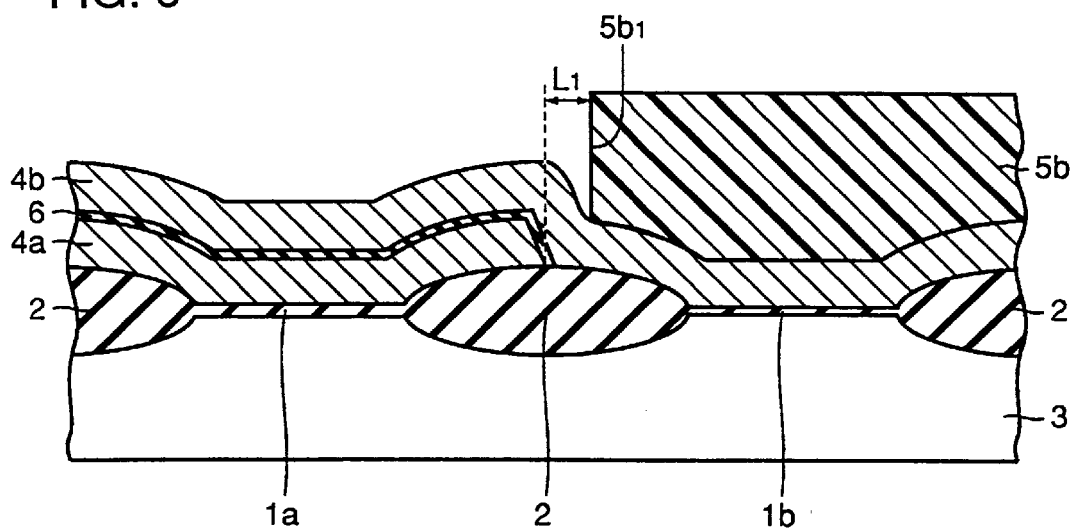

Referring to FIG. 6, a second polycrystalline silicon film 4b doped with an impurity is formed as a second protective film on the entire surface. A photoresist 5b is applied to the second polycrystalline silicon film 4b and patterned by common photolithography. Here, an end portion $5b_1$ of resist pattern 5b must be positioned slightly apart from the tapered side surface of the polycrystalline film 4a so that it does not overlap the side surface. Desirably, the distance $L_1$ should be about 0.5 μm to about 1.0 μm so as to relax step (level difference) which affects subsequent process step, though it depends on the size of the field oxide film 2.

Using resist pattern 5b as a mask, second polycrystalline silicon film 4b is etched, and thereafter resist pattern 5b is removed.

Figure 7:
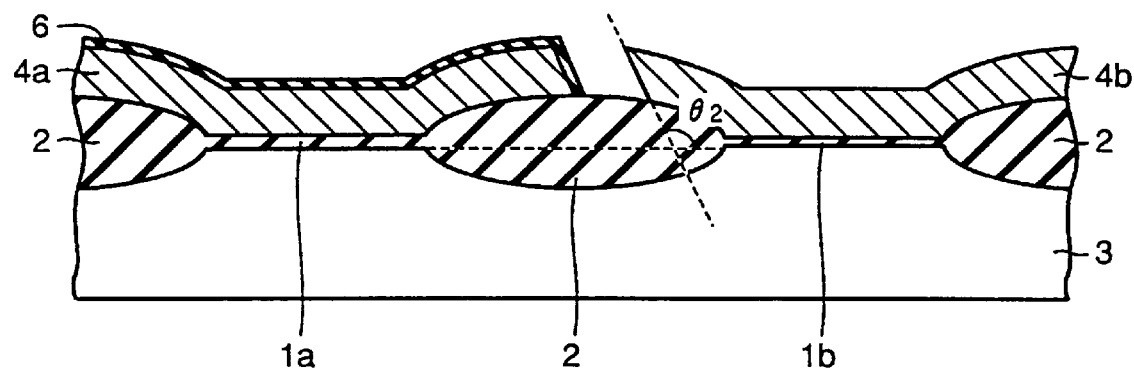

Referring to FIG. 7, by the etching, the second polycrystalline silicon film 4b is patterned. The side surface of the patterned second polycrystalline silicon film 4b is inclined, extending sideward toward the upper portion of silicon substrate 3, that is, the side surface has a so-called inversely tapered shape. The angle $\theta_2$ of inclination of the surface is controlled to be 100° to 110° with respect to the surface of silicon substrate 3.

In order to attain the inversely tapered shape, process condition must be set to ensure sufficient selectivity with respect to oxide coating 6. For example, the aforementioned inversely tapered shape and sufficient selectivity can both be attained by the etching process employing $Cl_2/O_2$ used in the electron cyclotron type etching apparatus when $O_2$ concentration is set as low as 5% or lower and RF power as low as about 20 to about 25 w.

Figure 23:
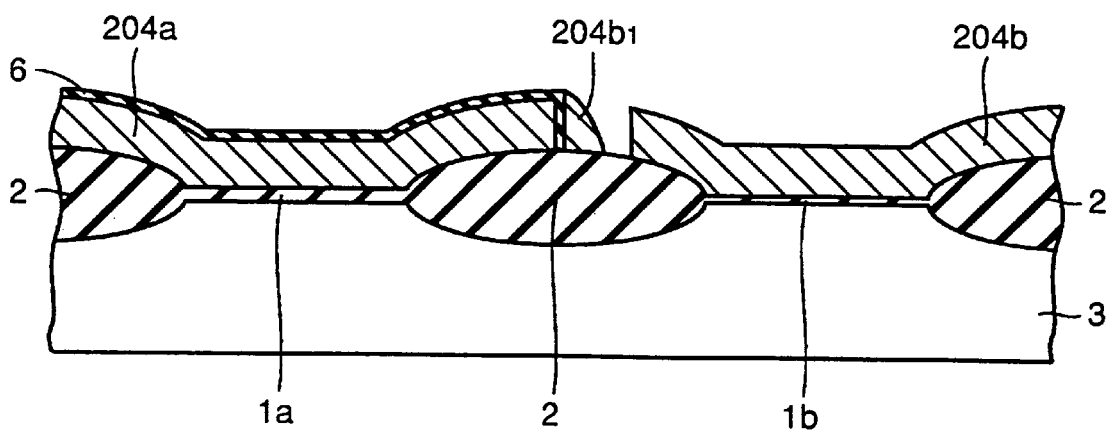

Etching of the side surface of second polycrystalline silicon film 4b to be the inversely tapered shape provides the effect of removing residue $204b_1$ in the shape of a sidewall spacer, shown in the prior art FIG. 23.

Thereafter, oxide coating 6 covering the surface of first polycrystalline silicon film 4a is removed.

Figure 8:
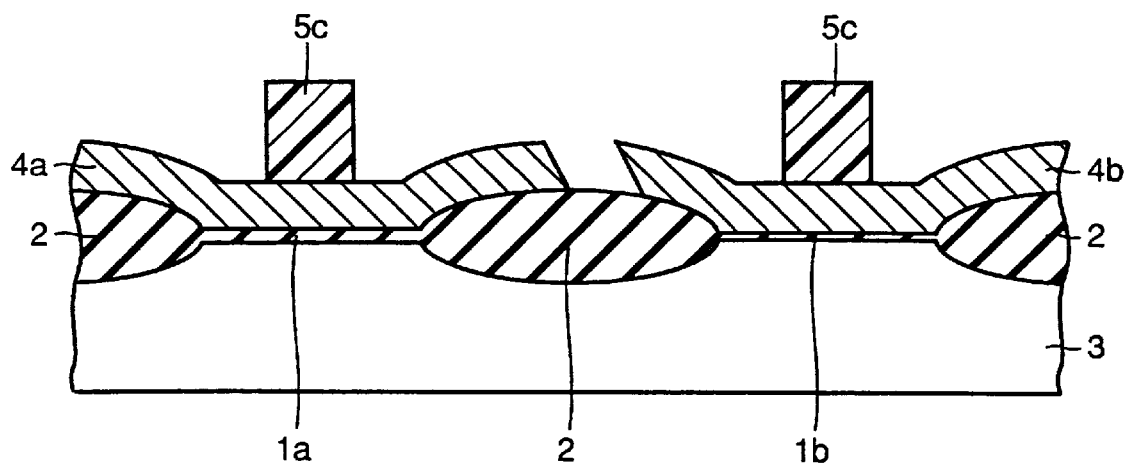
Figure 9:
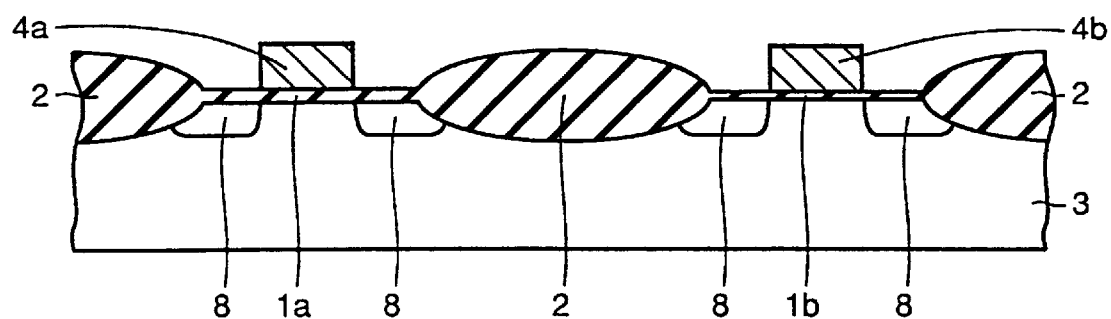

Referring to FIG. 8, a photoresist is applied to first and second polycrystalline silicon films 4a and 4b, and patterned by common photolithography. Using resist pattern 5c as a mask, first and second polycrystalline silicon films 4a and 4b are both unisotropically etched, and thus a gate electrode layer is formed. Thereafter, by introducing impurity using the gate electrode layer, field oxide film 2 and so on as a mask, a pair of source/drain regions 8 are formed at the surface of silicon substrate 3 on both sides of a lower region of gate electrode layer, and thus an MOS transistor is completed.

According to the manufacturing method of the present embodiment, the side surface of first polycrystalline silicon film 4a is tapered as shown in FIG. 4. Therefore, even when the second polycrystalline silicon film 4b is patterned in the process steps of FIGS. 6 and 7, the residue of second polycrystalline silicon film 4b is not left on the side surface of the first polycrystalline silicon film 4a. Therefore, a problem of short-circuit caused by the residue of polycrystalline silicon film 4b between other conductive layers can be prevented, and production yield is improved.

The etching condition to inversely taper the side surface of the second polycrystalline silicon film 4b has the effect of removing residue on the sidewall of first polycrystalline silicon film 4a, as shown in FIG. 7. Therefore, it further prevents residue from being left on the sidewall of first polycrystalline silicon film 4a, and hence production yield can further be improved.

In the present embodiment, photoresists 5a and 5b are never formed directly in contact with the first and second gate oxide films 1a and 1b in the process steps shown in FIGS. 3 and 6. Therefore, entrance of impurity such as Na from photoresists 5a and 5b to first and second gate oxide films 1a and 1b can be prevented, and reliability of the transistor is improved.

Further, the side surface of first polycrystalline silicon film 4a is inclined by the angle $\theta_1$ between 70° to 80° with respect to the surface of silicon substrate 3 as shown in FIG. 4. The reason why this angle is selected is as follows. When the angle of inclination is smaller than 70°, it is difficult to form the tapered shape simply by the step of etching. When the angle exceeds 80°, the effect of preventing residue left on the sidewall of first polycrystalline silicon film 4a is not sufficient.

The side surface of second polycrystalline silicon film 4b is inclined by the angle $\theta_2$ between 100° to 110° with respect to the surface of silicon substrate 3 as shown in FIG. 7. The reason why this angle is selected is as follows. When the angle of inclination $\theta_2$ is smaller than 100°, the effect of removing residue left on the sidewall of polycrystalline silicon film 4a is not sufficient, and if the angle exceeds 110°, it is difficult to form the inversely tapered shape simply by the step of etching.

Second Embodiment

In the process of the second embodiment, preferably, the first protective film 4a is a polycrystalline silicon film doped with an impurity and the second protective film 4b is an amorphous silicon layer doped with an impurity. The reason for this is that polycrystalline silicon film is easily tapered by etching and that amorphous silicon layer is easily inversely tapered by etching.

Except this point, the second embodiment is similar to the first embodiment, and therefore description thereof is not repeated.

Third Embodiment

In the first embodiment described above, the process is described in which a single layer of polycrystalline silicon film is used for the gate electrode. The gate electrode layer may be a stacked film (polycide structure) including a polycrystalline silicon film and a silicide layer typically represented by $WSi_x$.

Figure 10:
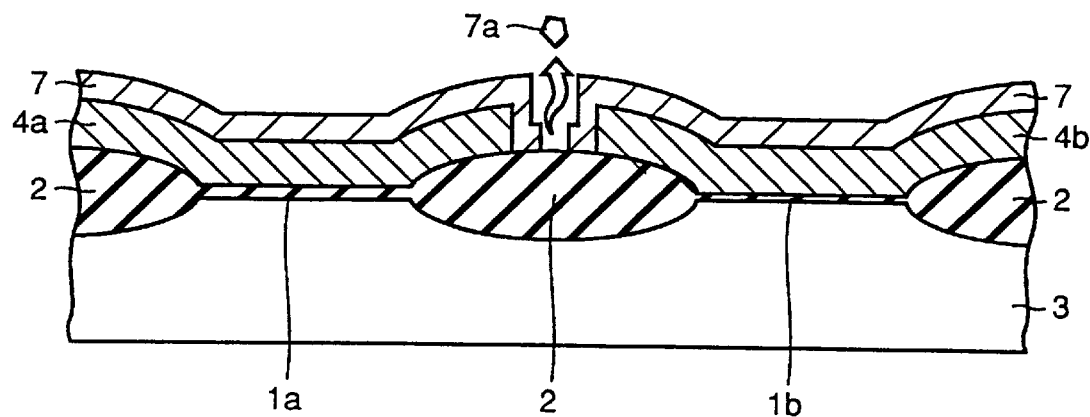
FIG. 10 is a cross section illustrating a problem experienced in a process where the gate electrode layer is adapted to have a polycide structure.

When the gate electrode layer has the polycide structure, oxide coating 6 is removed from the state of FIG. 7, and thereafter a silicide layer 7 is formed on the entire surface to attain the state shown in FIG. 10. Here, however, silicide layer 7 apts to be separated or peeled off from field oxide film 2, as shown in FIG. 10, and separated portion 7a will be foreign matter. Therefore, production yield of the devices is affected.

In view of the foregoing, a method of manufacturing a semiconductor device, which can suppress generation of foreign matters and can improve production yield even when the gate electrode is adapted to have the polycide structure, will be described as a third embodiment.

The method of manufacturing in accordance with the present embodiment proceeds through the same steps as the first embodiment shown in FIGS. 1 to 5. Thereafter, referring to FIG. 11, the second polycrystalline silicon film 4c doped with an impurity is formed on the entire surface, and the second polycrystalline silicon film 4c is patterned by common photolithography and etching. At the time of patterning, an end portion of second polycrystalline silicon film 4c is patterned to rest on an end portion of first polycrystalline silicon film 4a.

The length $L_2$ of overlap between the first and second polycrystalline silicon films 4a and 4c is, desirably, about 0.5 $\mu$m to 1.0 $\mu$m. By setting the length $L_2$ of the overlapping portion in this manner, it becomes possible to prevent exposure of field oxide film 2 from first and second polycrystalline silicon films 4a and 4c.

Figure 12:
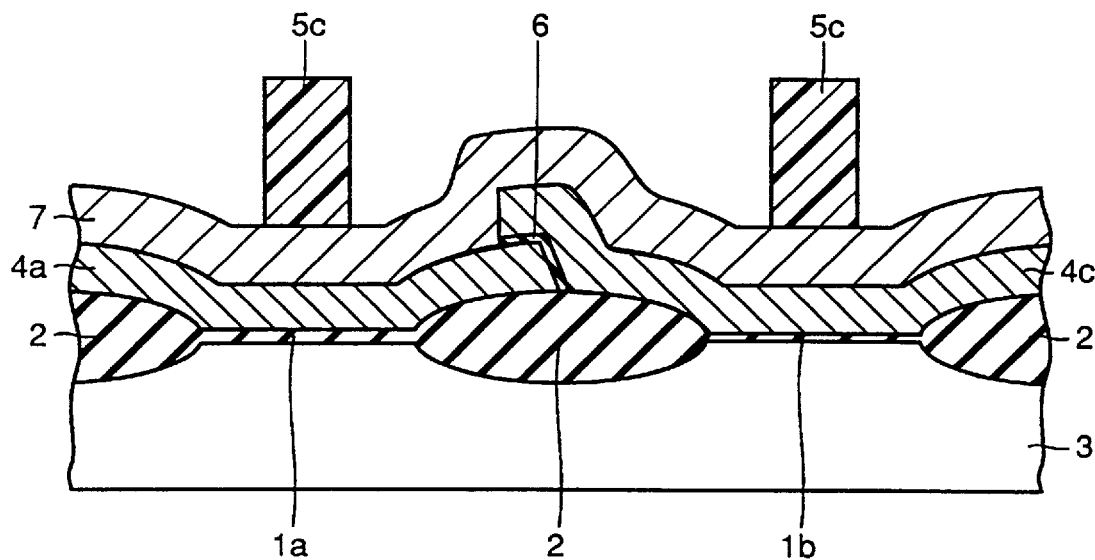

Referring to FIG. 12, a silicide layer 7 of $WSi_x$, $TiSi_x$ or the like is formed to be in contact with and covering the first and second polycrystalline silicon films 4a and 4c. Photoresist 5c is applied to silicide layer 7, and patterned by common photolithography. Using resist pattern 5c as a mask, silicide layer 7 and first and second polycrystalline silicon films 4a and 4c are unisotropically etched, and thereafter, resist pattern 5c is removed.

Figure 13:
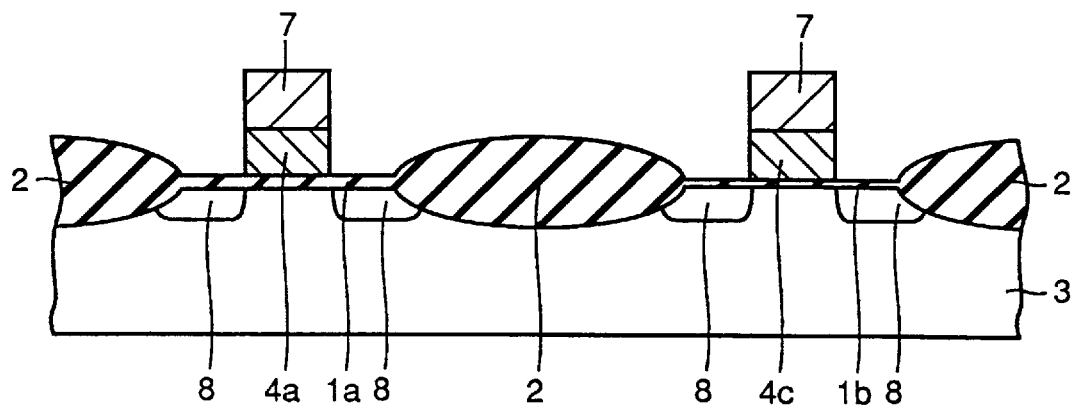
Figure 14:
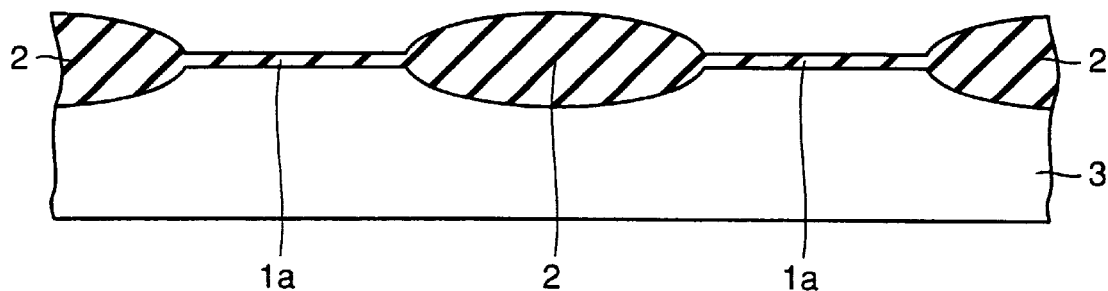
FIGS. 14 to 23 are schematic cross section showing, in order, the steps of the conventional method of manufacturing a semiconductor device.
Figure 15:
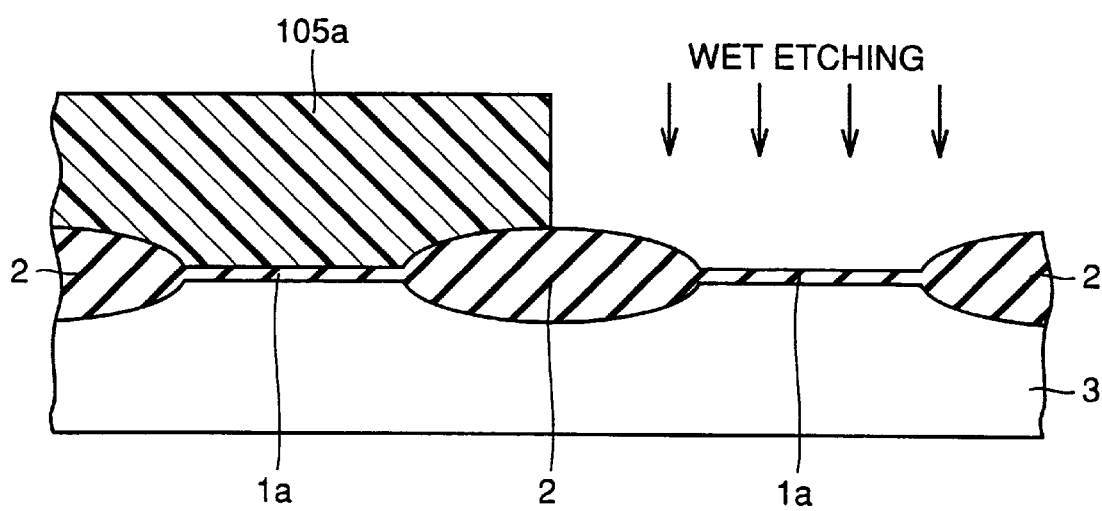
Figure 16:
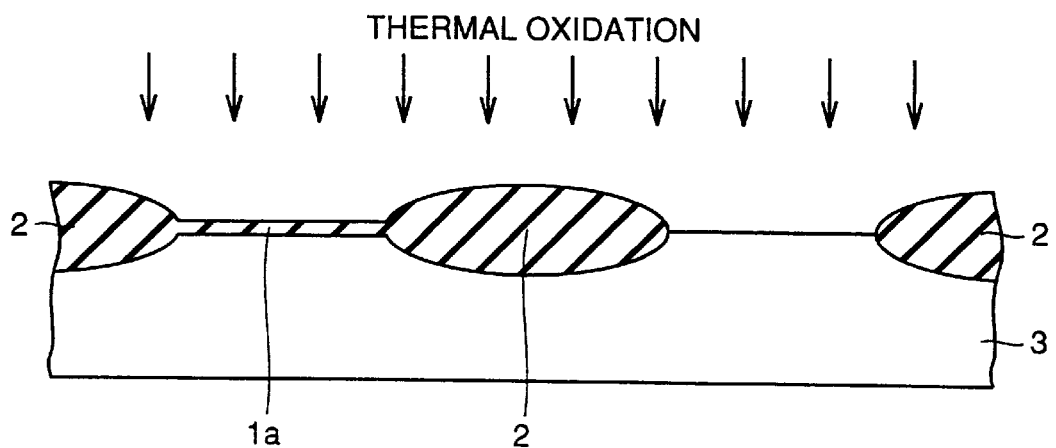
Figure 17:
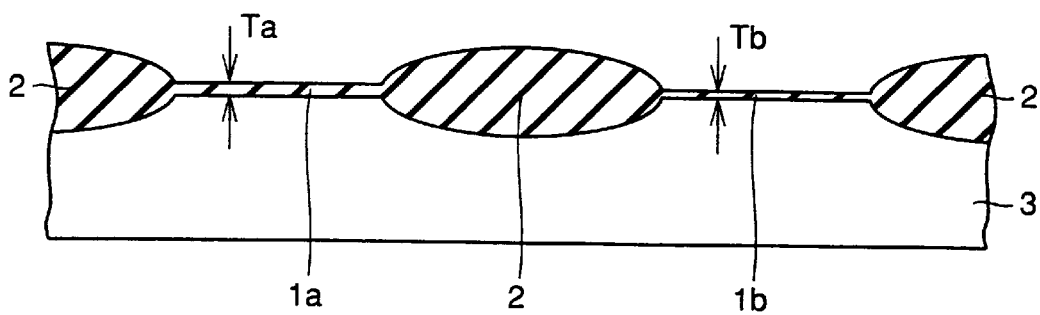
Figure 18:
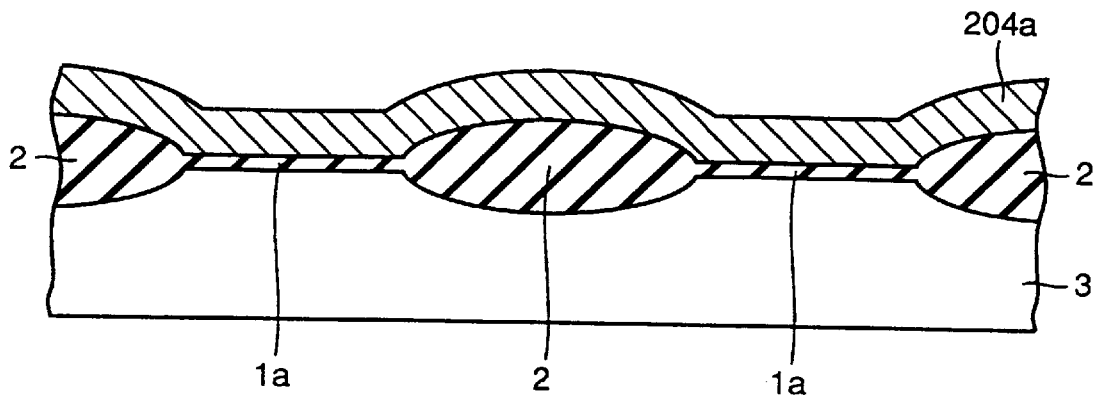
Figure 19:
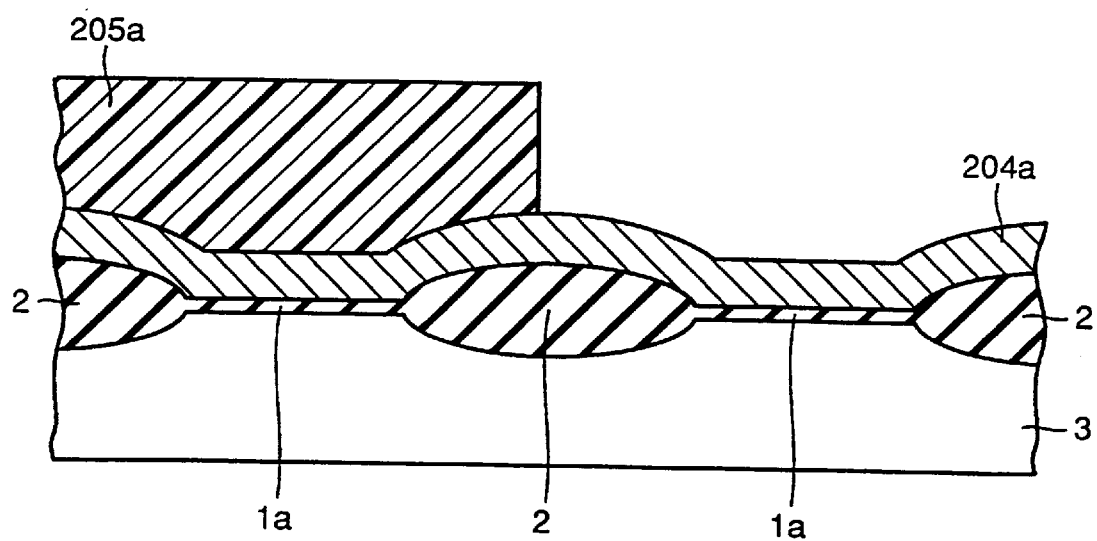
Figure 20:
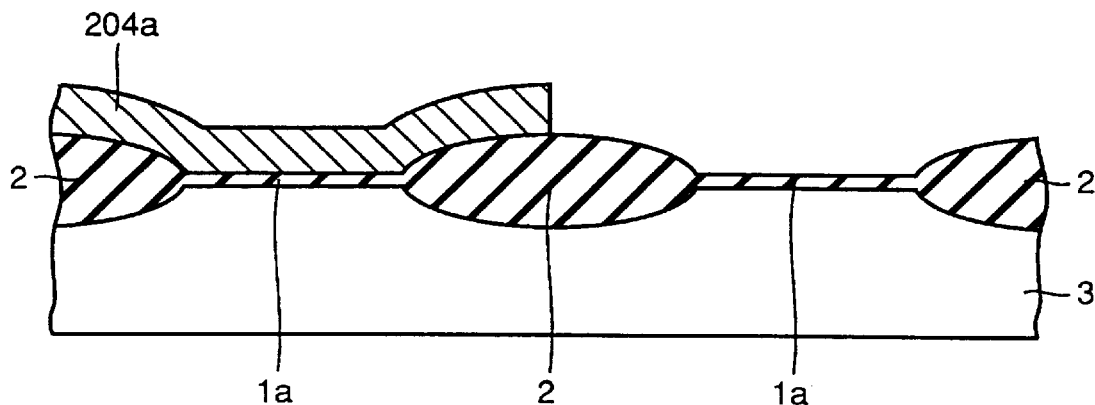
Figure 21:
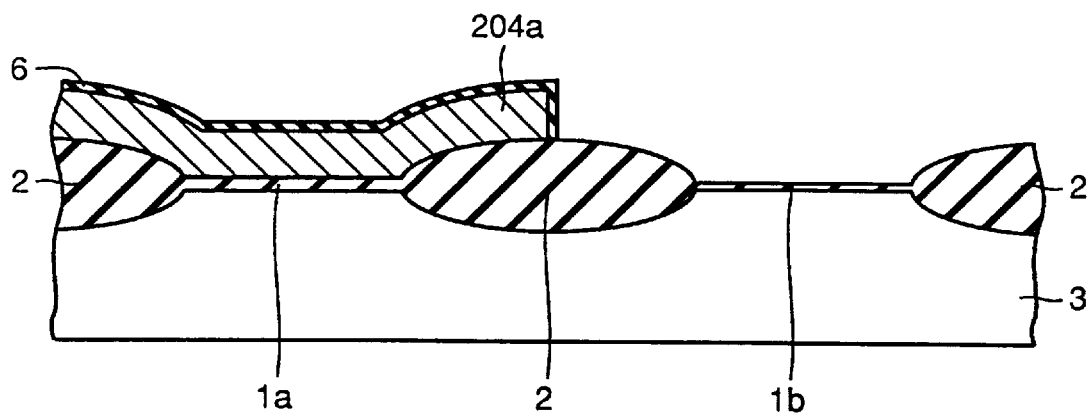
Figure 22:
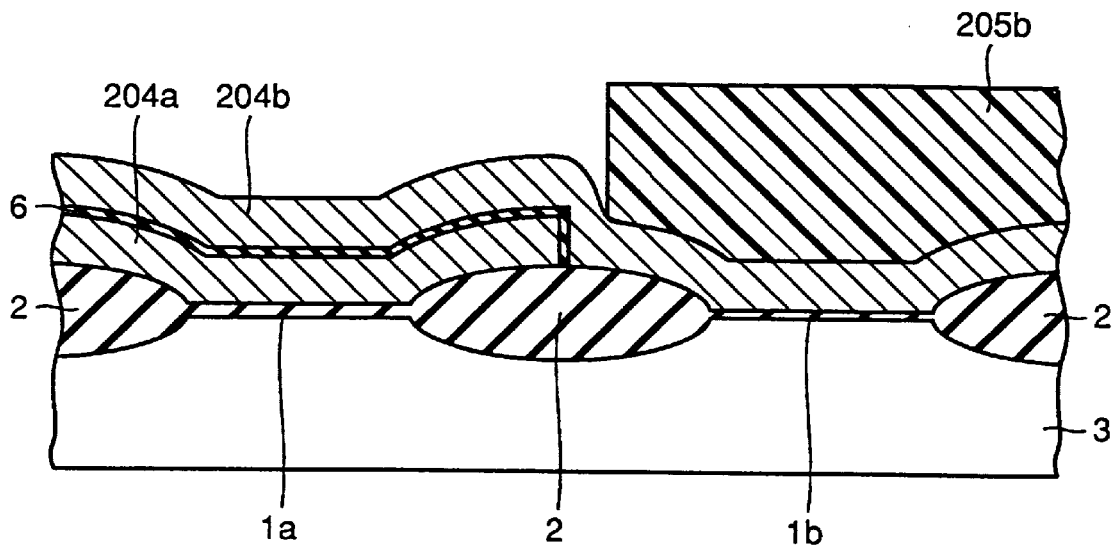

Referring to FIG. 13, by the etching, a gate electrode layer having a polycide structure including the first polycrystalline silicon film 4a and silicide layer 7 as well as a gate electrode layer having a polycide structure including the second polycrystalline silicon film 4c and silicide layer 7 are formed. Using the gate electrode layers, field oxide film 2 and so on as a mask, impurity is introduced, and thus a pair of source/drain regions 8 are formed at the surface of silicon substrate 3 on both sides of a lower region of gate electrode layer, and an MOS transistor is completed.

Figure 11:
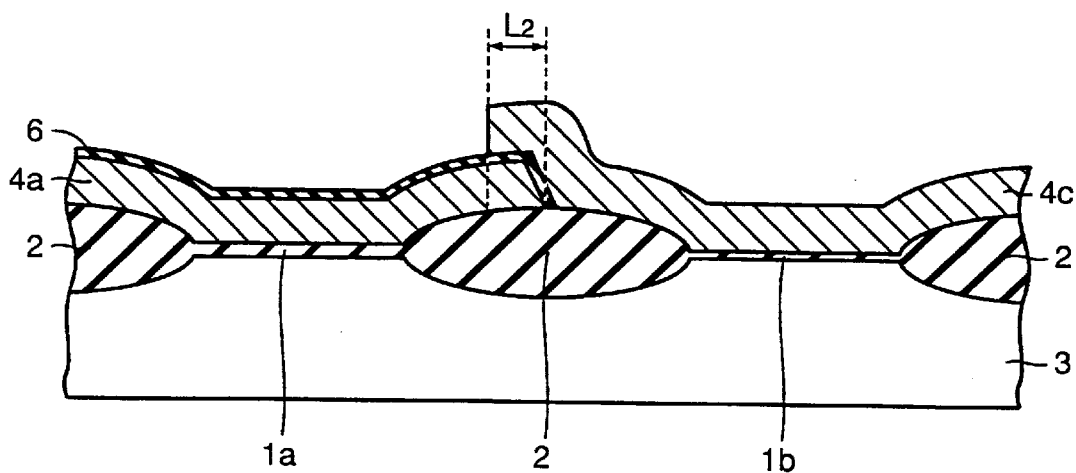
FIGS. 11 to 13 are cross sections showing, in order, the steps of the method of manufacturing a semiconductor device in accordance with a second embodiment of the present invention.

In the present embodiment, an end portion of second polycrystalline silicon film 4c is placed over an end portion of first polycrystalline silicon film 4a as shown in FIG. 11. Therefore, the surface of field oxide film 2 is completely covered by the first and second polycrystalline silicon films 4a and 4c. Therefore, when silicide layer 7 is subsequently formed on the entire surface as shown in FIG. 12, direct contact between silicide layer 7 and field oxide film 2 is prevented. Therefore, generation of foreign matters at the portion of direct contact between silicide layer 7 and field oxide film 2 can be prevented, and hence production yield can be improved.

Further, in this embodiment also, the photoresist is not directly formed on gate oxide films 1a and 1b, and therefore reliability of the transistor can be improved.

Though the first gate oxide film 1a is thicker than the second gate oxide film 1b in the above described first to third embodiments, the second gate oxide film 1b may be thicker than the first gate oxide film 1a. Preferably, however, the first gate oxide film 1a should be thicker than the second gate oxide film 1b taking into consideration the selectivity of the underlying layer when the first polycrystalline silicon film 4a is etched, as shown in FIGS. 3 and 4.

Though a silicon oxide film is used as the gate insulating layer in the above described first to third embodiments, material of the gate insulating layer is not limited thereto, and any material may be used as long as it is insulative.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having gate insulating layers of different film thicknesses, comprising the steps of:

forming a first gate insulating layer on a main surface of a semiconductor substrate;

forming a protective layer on said first gate insulating layer;

patterning said protective layer so that a part of a surface of said first gate insulating layer is exposed, and a side surface of patterned said protective layer is inclined surface extending sideward toward a lower portion; and adapting said first gate insulating layer at the portion exposed through said protective layer to be a second gate insulating layer having film thickness different from that of said first gate insulating layer.

2. The method of manufacturing a semiconductor device according to claim 1, wherein the side surface of said protective layer is inclined by at least 70° and at most 80° with respect to the main surface of said semiconductor substrate.

3. The method of manufacturing a semiconductor device according to claim 1, further comprising the steps of:

after forming said second gate insulating layer, forming a second protective layer on said second gate insulating layer and on said protective layer; and patterning said second protective layer so as to remove at least said second protective layer on said protective layer so that a side surface of patterned said second protective layer is opposed to the side surface of said protective layer with a space therebetween.

4. The method of manufacturing a semiconductor device according to claim 3, wherein the side surface of said second protective layer is an inclined surface extending sideward toward an upper portion.

5. The method of manufacturing a semiconductor device according to claim 4, wherein the side surface of said second protective layer is inclined by at least 100° and at most 110° with respect to the main surface of said semiconductor substrate.

6. The method of manufacturing a semiconductor device according to claim 4, wherein said protective layer is formed of a layer containing polycrystalline silicon, and said second protective layer is formed of a layer containing amorphous silicon.

7. The method of manufacturing a semiconductor device according to claim 3, wherein said protective layer and said second protective layer are conductive layers for a gate electrode.

8. A method of manufacturing a semiconductor device having gate insulating layers of different film thicknesses, comprising the steps of:

forming a first gate insulating layer on a main surface at a first region of a semiconductor substrate, the semiconductor substrate having said first region and a second region on both sides of an element isolating insulating layer;

forming a first gate electrode conductive layer covering said first gate insulating layer and having an upper surface and an end portion positioned on said element isolating insulating layer;

forming a second gate insulating layer having a film thickness different from that of said first gate insulating layer on the main surface of said second region of said semiconductor substrate;

forming a second gate electrode conductive layer covering said second gate insulating layer and having an end portion rested on said upper surface of said first gate electrode conductive layer; and forming a silicide layer to be in contact with respective upper surfaces of said first and second gate electrode conductive layers.

9. The method of manufacturing a semiconductor device according to claim 8, wherein said element isolating insulating layer is formed of a layer containing a silicon oxide film, and said first and second gate electrode conductive layers are formed of a layer containing polycrystalline silicon.

10. The method of manufacturing a semiconductor device according to claim 8, further comprising the step of patterning said first and second gate electrode conductive layers and said silicide layer to form a first gate electrode layer having a stacked structure including said first gate electrode conductive layer and said silicide layer and a second gate electrode layer having a stacked structure including said second gate electrode conductive layer and said silicide layer.

* * * * *